United States Patent [19]

Kawasaki

[11] Patent Number: 5,065,057

[45] Date of Patent: Nov. 12, 1991

[54] ANALOG SIGNAL INPUT CIRCUIT

[75] Inventor: Masayuki Kawasaki, Ooita, Japan

[73] Assignee: Kabushiki Kaisha Toshiba, Kawasaki, Japan

[21] Appl. No.: 466,474

[22] Filed: Jan. 17, 1990

[30] Foreign Application Priority Data

Jan. 17, 1989 [JP] Japan .................. 1-8001

[51] Int. Cl.[5] .................. H03K 3/01; H03K 19/094
[52] U.S. Cl. .................. 307/572; 307/451; 307/579; 307/585; 307/296.4; 307/296.5; 357/23.13
[58] Field of Search .............. 307/443, 451, 572, 579, 307/585, 296.4–296.5; 357/23.13

[56] References Cited

U.S. PATENT DOCUMENTS

| 4,511,814 | 4/1985 | Matsuo et al. | 307/579 |
| 4,599,522 | 7/1986 | Matsuo et al. | 307/579 |
| 4,752,704 | 6/1988 | Baccarani et al. | 307/579 |
| 4,890,012 | 12/1989 | Stockinger | 307/585 |
| 4,922,371 | 5/1990 | Gray et al. | 357/23.13 |

FOREIGN PATENT DOCUMENTS 5564437 11/1978 Japan .................. 307/585

Primary Examiner—Stanley D. Miller
Assistant Examiner—Margaret R. Wambach
Attorney, Agent, or Firm—Oblon, Spivak, McClelland, Maier & Neustadt

[57] ABSTRACT

An analog signal input circuit comprises a plurality of input terminals, an output node, a plurality of p-type first FETs inserted between the input terminals and the output node, and a plurality of n-type second FETs inserted between the input terminals and the output node. The gate terminals of the first FETs are supplied with first control signals, and the substrates thereof are connected to a positive potential power source terminal. The source of one first FET is connected to the drain of another. The gate terminals of the second FETs are supplied with second control signals. The second FETs have parasitic bipolar transistors which function as PN junctions whose conduction directions are opposite with reference to each other. The source of one second FET is connected to the drain of another.

30 Claims, 6 Drawing Sheets

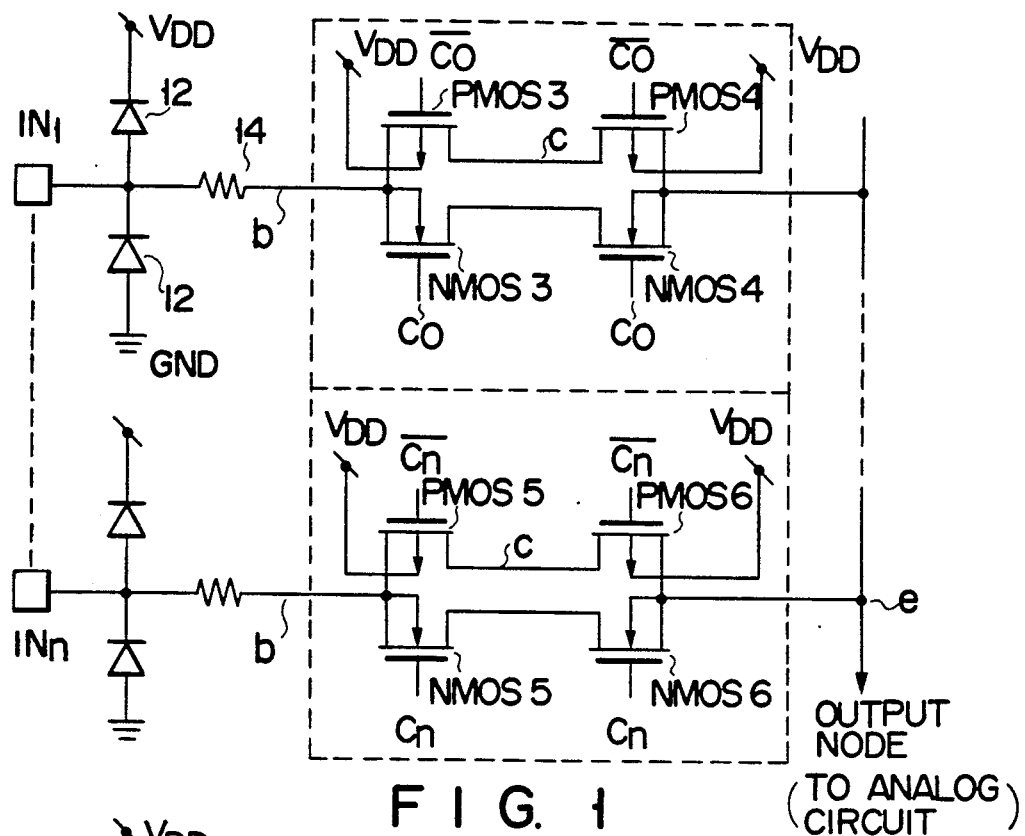
F I G. 1
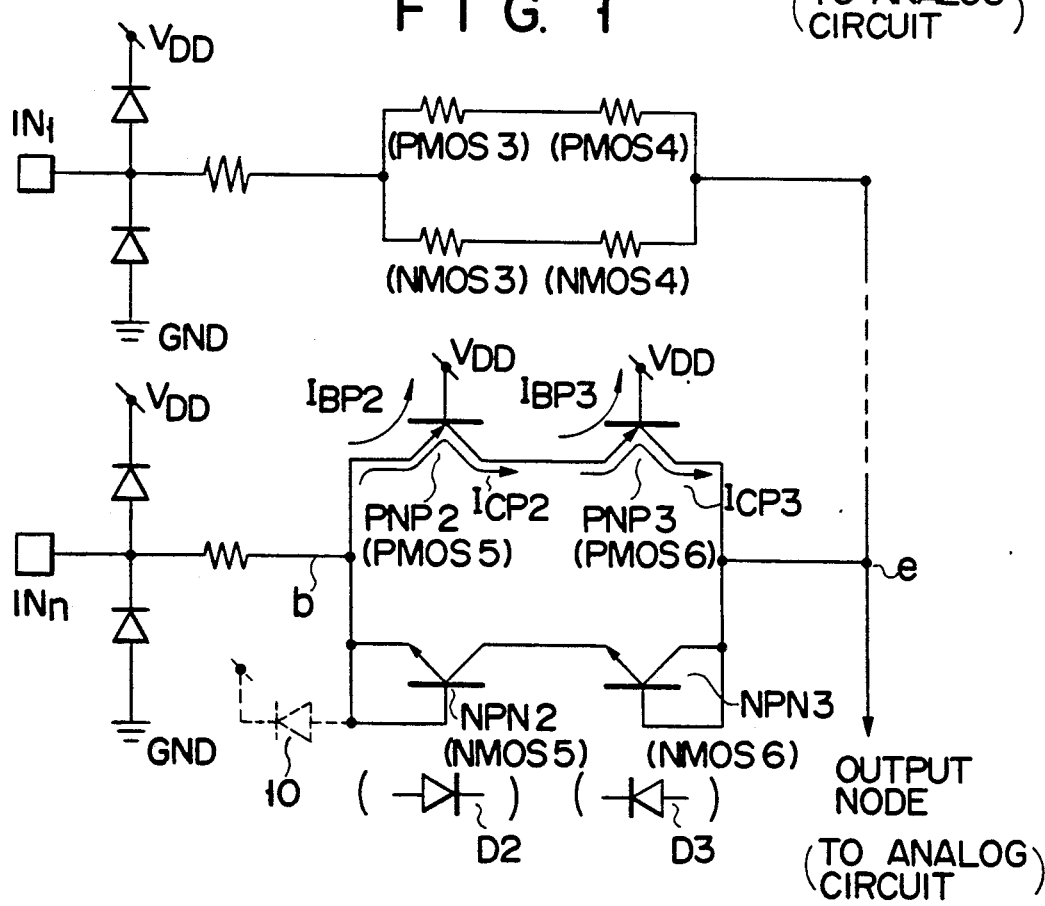
F I G. 2

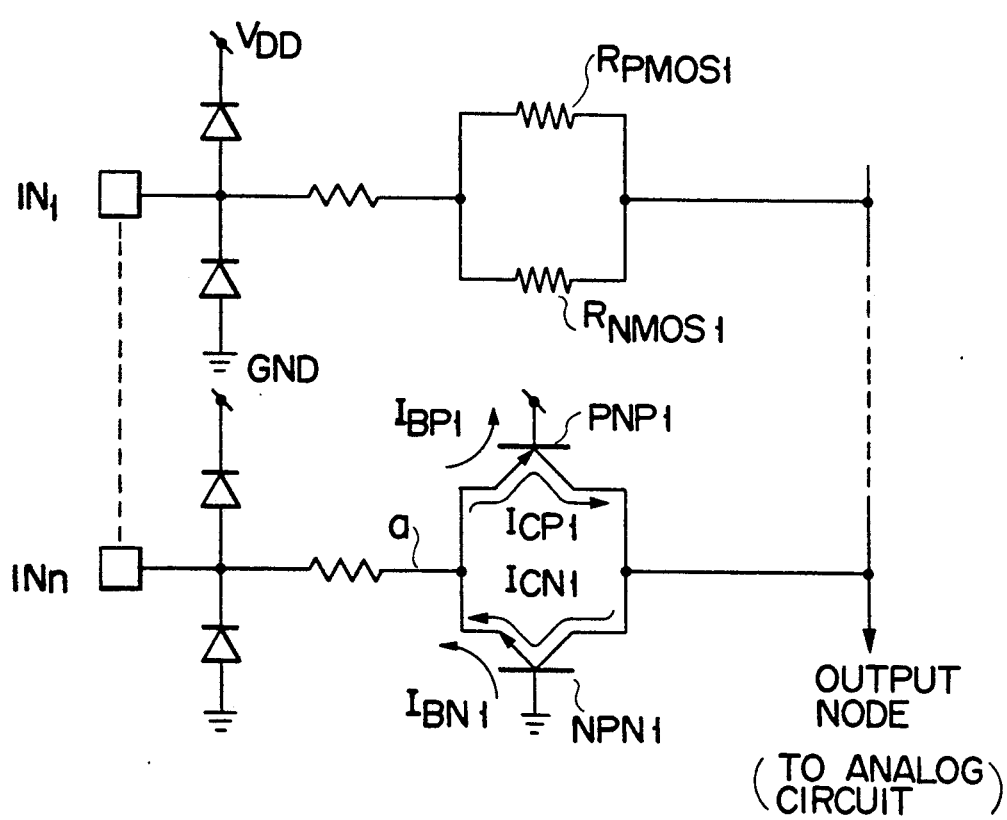
F I G. 4

ANALOG SIGNAL INPUT CIRCUIT

BACKGROUND OF THE INVENTION

1. Field of the Invention

The present invention relates to an analog signal input circuit employed in a complementary MOS integrated circuit, and more particularly to an analog signal input circuit inserted immediately before the input terminal of a device which is required of high accuracy, as in the case of an analog-to-digital converter (hereinafter referred to as an A/D converter).

2. Description of the Related Art

FIG. 3 shows a conventional analog input type multiplexing circuit employed in an A/D converter. The multiplexing circuit has a plurality of analog input terminals IN1 to INn. Of these analog input terminals, one is selected on the basis of selection signals C0 to Cn. An analog signal is input to the multiplexing circuit through the selected analog input terminal, and is then supplied to a load connected to the output terminal of the multiplexing circuit.

In the case of an A/D converter having a plurality of analog signal input terminals, it may happen that either a voltage higher than the power source voltage or a voltage lower than the ground-level voltage will be applied to non-selected input terminals. Even if this happens, the accuracy of the A/D converter should be kept unchanged.

However, the conventional multiplexing circuit shown in FIG. 3 has problems connection with this matter. Let it be assumed that a voltage higher than the power source voltage or lower than the ground-level voltage is applied to a non-selected analog signal input terminal of the conventional multiplexing circuit. In this case, a bipolar transistor which is parasitic on the MOSFET structure at the non-selected input terminal conducts a small amount of current. This current flows to the output terminal of the multiplexing circuit, thus producing an error in the analog signal to be supplied to the A/D converter. As a result, the accuracy of the A/D converter is adversely affected. The parasitic transistor is a PNP or NPN transistor component which is undesirably formed when an MOSFET is formed.

The above-mentioned problem will be explained in more detail, with reference to FIG. 4 showing an equivalent circuit corresponding to a conventional analog signal input circuit. In the explanation below, it is assumed that the power source voltage is 5V, and the voltage applied to an input terminal is ±10V.

Assume that, in the circuit shown in FIG. 3, a voltage of ±10V is applied to input terminal INn, with an analog signal in the range of 0 to 5V supplied to input terminal IN1. In this case, a current flows from input terminal INn to positive power source VDD through protective diodes, so that the potential at input terminal INn gradually becomes closer to 5V. However, since a voltage drop occurs due to diodes connected in the forward direction or due to a parasitic resistor produced in the path of current $I_{BPI}$, the potential at input terminal INn is actually higher than 5V by about 0.5 to 0.6V. Therefore, parasitic bipolar transistor PNP1 whose base potential is fixed to 5V becomes slightly conductive, with the result that current $I_{CPI}$ flows to the output terminal via an input-protecting resistor and the emitter-collector path of transistor PNP1. Accordingly, an error corresponding to current $I_{CPI}$ is produced in the analog signal supplied from input terminal IN1 to the output terminal.

A similar problem also occurs in the case where a voltage of −10V is applied to input terminal INn. In this case, the potential at input terminal INn lowers by a value corresponding to the base-emitter threshold voltage $V_{BE}$ of parasitic bipolar transistor NPN1 (the base-emitter threshold voltage being about 0.5 to 0.6V if the parasitic bipolar transistor is a silicon transistor), so that parasitic bipolar transistor NPN1 becomes slightly conductive. As a result, current ICNI, which corresponds to the positive potential of the analog signal at the output terminal, flows to input terminal INn via the emitter-collector path of bipolar transistor NPN1. As a result, the voltage of the analog signal at the output terminal cf the multiplexing circuit may be varied.

SUMMARY OF THE INVENTION

Accordingly, an object of the present invention is to provide an analog signal input circuit which prevents degradation of the signal accuracy of an analog signal supplied to a selected input node even if a parasitic bipolar transistor structure connected to an non-selected input node is undesirably held conductive.

To achieve this object, the present invention provides an analog signal input circuit wherein a plurality of first-conductivity type (e.g., p-type) MOS transistors (PMOS5, PMOS6) connected in series and a plurality of second-conductivity type (e g., n-type) MOS transistors (NMOS5, NMOS6) connected in series are inserted between output node e and each of input terminals In1–INn. First control signal $\overline{Cn}$ is applied to the gate of each p-type MOS transistor, and a predetermined potential (e.g., +5V) is applied to the substrate of each p-type MOS transistor.

Second control signal Cn, which has an inverted phase with reference to first control signal $\overline{Cn}$, is applied to the gate of each n-type MOS transistor. The substrate of one n-type MOS transistor (e.g., the substrate of n-type MOS transistor NMOS5) is connected to a signal circuit leading to input terminal INn while the substrate of another n-type MOS transistor (e.g., the substrate of n-type MOS transistor NMOS6) is connected to a signal circuit leading to output node e.

The above-mentioned circuit operates as below if the signal levels of the first and second control signals ($\overline{C0}$ to $\overline{Cn}$, C0 to Cn) are determined such that they select first input terminal IN1 and do not select n-th input terminal INn.

(1) In the case where a positive-level voltage (e.g., +10V) greatly exceeding first predetermined potential VDD (e.g., +5V) is applied to non-selected n-th input terminal INn:

In this case, parasitic PNP transistor PNP2 is produced on the input side of PMOS transistor PMOS5 connected to n-th input terminal INn. Since the potential at the emitter of this parasitic PN transistor is higher than the potential at the base thereof (the potential at the base: VDD = +5V), the emitter-collector path of the parasitic PNP transistor is held in conduction.

It should be noted that common-base current gain $\alpha$ of the input-side parasitic PNP transistor (PNP2) is about 0.5 to 0.6 and is thus far smaller than current gain $\alpha$ (normally, 0.9 or more) of a bipolar transistor intentionally formed.

In other words, a leakage current is reduced when it flows through parasitic PNP transistor PNP located on the side of the n-th input terminal, and is about 0.5 to 0.6 times as small as the original leakage current when it reaches the emitter of PMOS transistor PMOS6 located on the side of n-th output node e. This leakage current is further reduced when it flows through parasitic PNP transistor PNP3 (which is parasitic on PMOS transistor PMOS6 located on the side of n-th output terminal e) since current gain α of parasitic PNP transistor PNP3 is about 0.5 to 0.6. As a result, the leakage current is about 0.25 to 0.36 times as small as the original leakage current. Therefore, the degree of the conduction of the emitter-collector path is very small if PNP transistors PNP2 and PNP3 connected in series are considered as a whole.

As mentioned above, the substrate of one n-type MOS transistor NMOS5 is connected to a signal circuit leading to input terminal INn. Therefore, NPN bipolar transistor NPN2 parasitic on this MOS transistor NMOS5 is considered equivalent to PN junction diode D whose anode is connected to input terminal INn. Further, the substrate of another n-type MOS transistor NMOS6 is connected to a signal circuit leading to output node e, so that NPN bipolar transistor NPN3 parasitic on this MOS transistor NMOS6 is considered equivalent to PN junction diode D3 whose anode is connected to output node e. The cathode of one PN junction diode D2 (i.e., MOS transistor NMOS5) is regarded as being connected to the cathode of the other PN junction diode D3 (i.e., MOS transistor NMOS6).

As may be understood from the above, the two PN junction diodes D2 and D3 are connected in series with each other, with their conducting directions being opposite to each other. Therefore, if the potential at input terminal INn is higher than that at output node e, PN junction diode D3 is biased in the reverse direction and is therefore held in a non-conducting state. Conversely, if the potential at input terminal INn is lower than that at output node e, then PN junction diode D2 is biased in the reverse direction and is therefore held in a non-conducting state. Accordingly, it can be understood that the emitter-collector paths of both NPN transistors NPN2 and NPN3 are held in a non-conducting state, without reference to any potential difference between input terminal INn and output node e.

Assume that a positive-level voltage (e.g., +10V) greatly exceeding first predetermined potential VDD (=+5V) is applied to non-selected n-th input terminal INn. Although a current is produced by application of the voltage, only a small amount of it leaks through PNP transistors PNP2 and PNP3 and reaches output node e. In addition, it never leaks through NPN transistors NPN2 and NPN3. Therefore, the accuracy of an analog signal appearing at output node e is reliably prevented from being degraded.

(2) In the case where a negative-level voltage (e.g., -10V) lower than a ground-level voltage (e.g., =0V) is applied to non-selected n-th input terminal INn:

In this case, parasitic PNP transistor PNP2 is produced on the input side of PMOS transistor PMOS5 connected to n-th input terminal INn. Since the potential at the emitter of this parasitic PNP transistor is lower than the potential at the base thereof (the potential at the base: VDD=+5V), the emitter-collector path of the parasitic PNP transistor is held in a non-conducting condition. Therefore, the emitter-collector paths of both PNP transistors PNP2 and PNP3 are held in a nonconducting condition.

As mentioned above, the emitter-collector paths of both NPN transistors NPN2 and NPN3 are held in a nonconducting state, without reference to any potential difference between input terminal INn and output node e.

As can be understood from the above, even if a negative-level voltage (e.g., -10V) lower than the second predetermined potential (i.e., a ground-level potential of 0V) is applied to non-selected n-th input terminal INn, a current arising from the application of the negative-level voltage does not flow through PNP transistors PNP2 and PNP3 or through NPN transistors NPN2 and NPN3. Since the current does not reach output node e, the accuracy of the analog signal appearing at output node e is never degraded.

BRIEF DESCRIPTION OF THE DRAWINGS

FIG. 1 is a circuit diagram of an analog signal input circuit according to one embodiment of the present invention;

FIG. 2 is an equivalent circuit diagram corresponding to the analog signal input circuit shown in FIG. 1;

FIG. 4 is an equivalent circuit diagram corresponding to the conventional analog signal input circuit shown in FIG. 3;

DETAILED DESCRIPTION OF THE PREFERRED EMBODIMENTS

FIG. 1 is a circuit diagram of an analog signal input circuit according to one embodiment of the present invention, the analog signal input circuit including a CMOS formed by use of a p-type well. FIG. 2 shows an equivalent circuit corresponding to the analog signal input circuit, the equivalent circuit being shown in conjunction with parasitic transistors. Referring to FIGS. 1 and 2, input terminals IN1 to INn are connected together by use of protective diodes 12 such that the input terminals are at predetermined potential levels, respectively. One end of a transistor group including p-type FETs PMOS3 and PMOS4 is connected to each of input terminals IN1 to INn through resistor 14. The other end of this transistor group is connected to output node e. The source of FET PMOS3 is connected in series to the drain of FET PMOS4. Likewise, one end of a transistor group including n-type FETs NMOS3 and NMOS4 is connected to each of input terminals IN1 to IN through resistor 14. The other end of this transistor group is connected to output node e. The source of FET 3 is connected in series to the drain of FET NMOS4. Control signals $\overline{Co}$ to $\overline{Cn}$ are applied to the gates of the p-type FETs, while control signals Co to Cn having inverted phases with reference to control signals $\overline{C_0}$ to $\overline{C_n}$ are applied to the gates of the n-type FETs.

Figure 8:
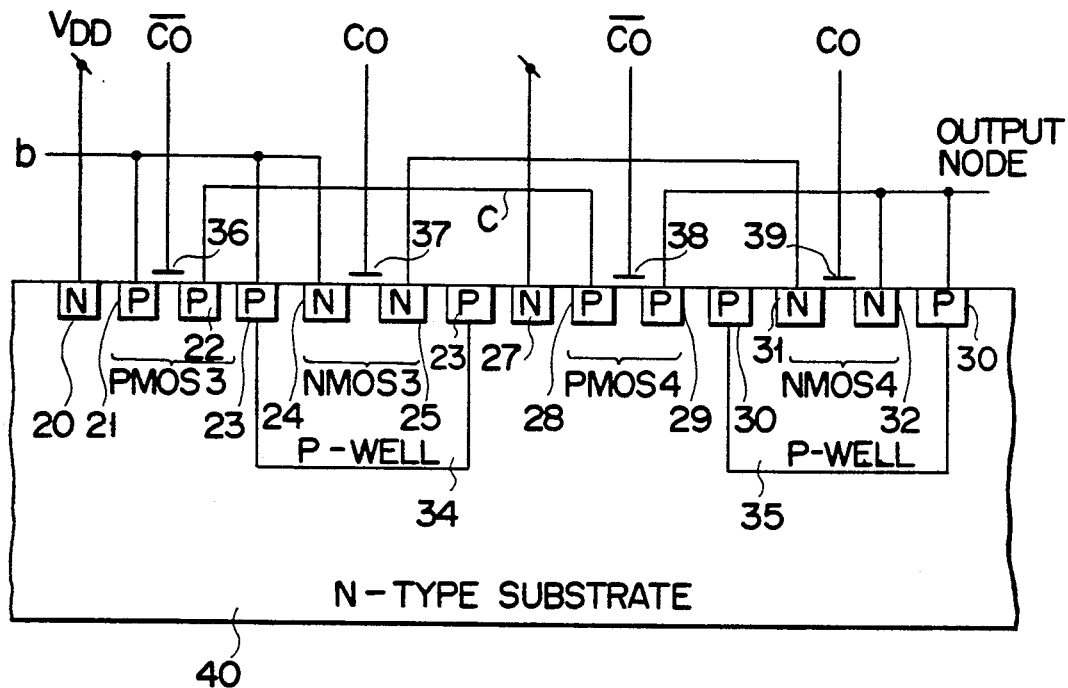
FIG. 8 is a cross sectional view of a semiconductor device incorporating the circuit shown in FIG. 1.

FIG. 8 is a cross sectional view of a semiconductor device incorporating the circuit shown in FIG. 1. A description will be given as to how the semiconductor device is manufactured. First, p-type wells 34 and 35 are formed in predetermined regions of n-type substrate 40. Next, n-type diffusion layer 20, and p-type diffusion layers 21, 22 and 23 are formed in upper regions of n-type substrate 40. Thereafter, p-type MOSFET 3 is formed by providing gate terminal 36 above the region located between p-type diffusion layers 21 and 22.

N-type diffusion layers 24 and 25, and p-type diffusion layer 26 are formed in upper regions of p-type well 35. N-type MOSFET 3 is formed by providing gate terminal 37 above the region located between n-type diffusion layers 24 and 25.

N-type diffusion layer 27, and p-type diffusion layers 28 and 29 are formed in upper regions of n-type substrate 40. P-type MOSFET 4 is formed by providing gate terminal 38 above the region located between p-type diffusion layers 28 and 29.

P-type diffusion layer 30, n-type diffusion layers 31 and 32, and p-type diffusion layer 33 are formed in upper regions of p-type well 35. N-type MOSFET 4 is formed by providing gate terminal 39 above the region located between n-type diffusion layers 31 and 32.

The diffusion layers mentioned above are connected together by providing wiring on the surface of n-type substrate 40 in such a manner that the circuit shown in FIG. 1 is obtained.

Assume that a voltage of +10V is applied to nonselected input terminal INn, with an analog signal in the range of 0 to 5V supplied to selected analog signal input terminal IN1. In this case, the potential at point b is the same as that at point a indicated in the FIG. 4 equivalent circuit corresponding to the conventional case. Therefore, base current IBP2 of bipolar transistor PNP2 is considered equal to base current IBP1 of transistor PNP1 of the conventional case. Likewise, collector current ICP2 of bipolar transistor PNP2 is considered equal to collector current ICP1 of transistor PNP1 of the conventional case.

Collector current ICP2 flows as both base current IBP3 and collector current ICP3 of bipolar transistor PNP3. In other words, ICP2=IBP3+ICP3.

It should be noted that bipolar transistors PNP2 and PNP3 are both parasitic lateral transistors produced when an MOSFET is formed. Therefore, their current gains α (i.e., IB [base current]/IE [emitter current]) are about 0.5 to 0.6.

Assume that the current gain of each of bipolar transistors PNP1, PNP2 and PNP3 is 0.6. If parasitic bipolar transistors PNP2 and PNP3 are connected in series, the current flowing from input terminal INn and adversely affecting an analog signal can be reduced to be 0.6 times as small as the corresponding current of the conventional case. Therefore, an error in the analog signal can be reduced.

Parasitic bipolar transistors NPN2 and NPN3 do not permit current to flow through them. This is because parasitic bipolar transistor NPN3 is diode-connected to the circuit and is therefore applied with a reverse bias. Therefore, an analog signal is prevented from including an error, in spite of formation of the parasitic bipolar transistors.

In the case where −10V is applied to input terminal INn, each of parasitic bipolar transistors PNP2 and NPN2 is applied with a reverse bias. Since, therefore, no current flows through these parasitic bipolar transistors, no error is included in the analog signal.

FIGS. 5 through 9 show other embodiments of the present invention; for simplicity, they show only the part corresponding to the circuit portion enclosed by the broken lines in FIG. 1.

Figure 3:
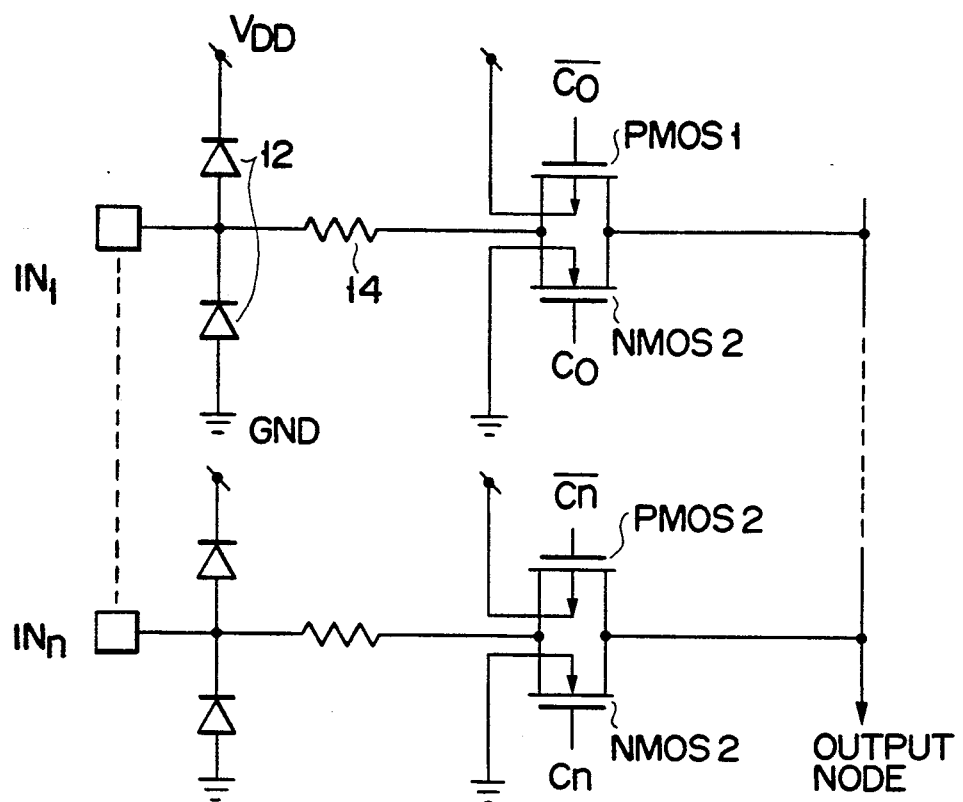
FIG. 3 is a circuit diagram of a conventional analog signal input circuit.
Figure 5:
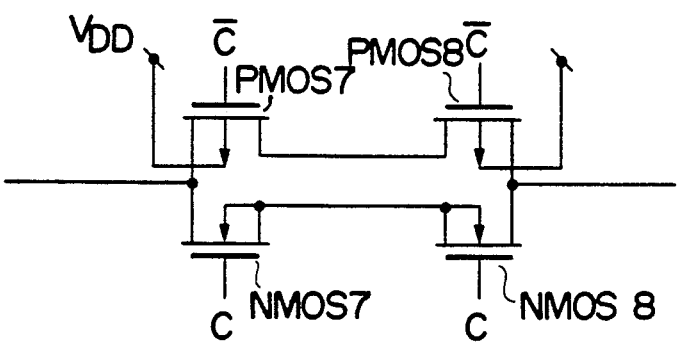
FIGS. 5 through 7 are circuit diagrams of analog signal input circuits according to other embodiments of the present invention.
Figure 9:
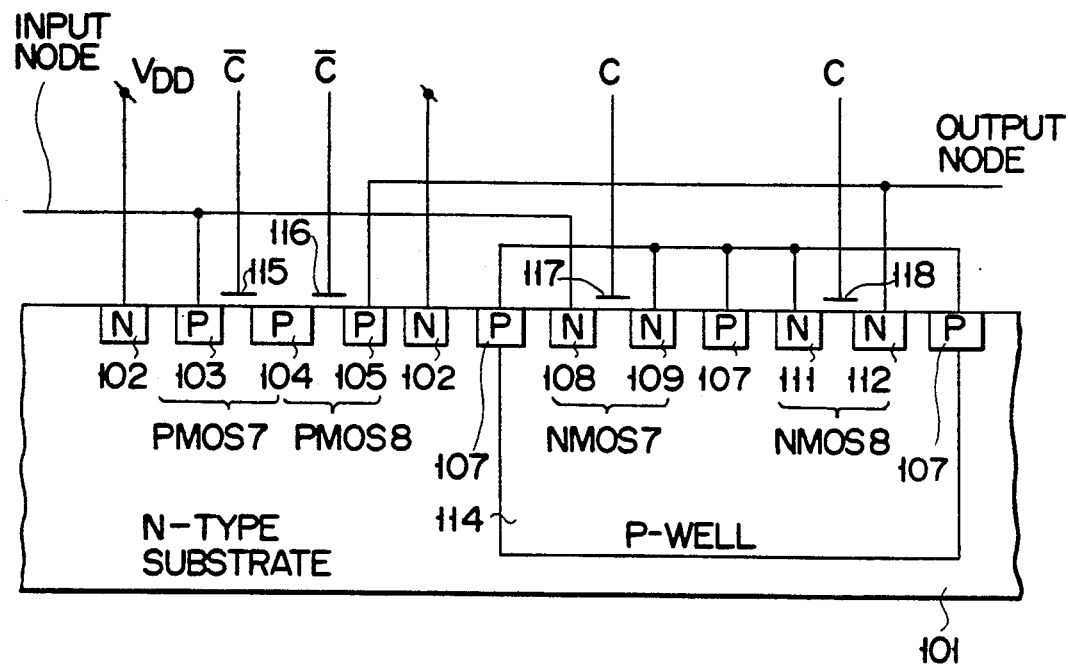
FIG. 9 is a cross sectional view of a semiconductor device incorporating the circuit shown in FIG. 5.

FIG. 5 shows the second embodiment of the present invention, and FIG. 9 is a cross sectional view of a semiconductor device incorporating the circuit shown in FIG. 5. A description will be given as to how the semiconductor device shown in FIG. 9 is manufactured. First, p-type well 114 is formed in an upper region of n-type substrate 101. N-type diffusion layer 102 is formed in an upper region of semiconductor substrate 101, and is connected to positive power source terminal VDD. P-type diffusion layers 103, 104 and 105 are formed in upper regions of substrate 101, and gates 115 and 116 are formed such that gate 115 is located above the region between p-type diffusion layers 103 and 104 and such that gate 116 is located above the region between p-type diffusion layers 104 and 105. Further, n-type diffusion layer 106 is formed in an upper region of substrate 101. P-type diffusion layers 103 and 104 and gate 115 constitute p-type MOSFET PMOS7. Likewise, p-type diffusion layers 104 and 105 and gate 116 constitute p-type MOSFET PMOS8. P-type diffusion layer 107 is formed in an upper region of p-type well 114, and n-type diffusion layers 108 and 109 are formed on the side of p-type diffusion layer 107 such that they are isolated from p-type diffusion layer 107. Gate 117 is formed above the region located between n-type diffusion layers 108 and 109, thereby forming n-type MOSFET NMOS7. P-type diffusion layer 110 is formed on the side of this n-type MOSFET. N-type diffusion layers 111 and 112 are formed on the side of p-type diffusion layer 110 such that they are isolated from p-type diffusion layer 110. Gate 118 is formed above the region located between n-type diffusion layers 111 and 112, to thereby forming n-type MOSFET NMOS8. P-type diffusion layer 113 is formed on the side of this n-type MOSFET. Consequently, FET of NMOS7 and NMOS8 can be formed on one well. Therefore, it is possible to realize semiconductor devices of more smaller size. The above-mentioned diffusion layers are connected together by external wiring in such a manner as to obtain the circuit configuration shown in FIG. 5.

In the embodiment shown in FIG. 5, n-type MOSFETs NMOS7 and NMOS8 are formed in the same p-type well and are located adjacent to each other. Further, p-type MOSFETs PMOS7 and PMOS8 are formed in upper regions of the same n-type substrate and are located adjacent to each other. Since the p-type well potentials of both NMOS7 and NMOS8 are the same, they can be formed in the same well. Therefore the pattern size can be reduced more remarkably than that of the first embodiment.

Figure 6:
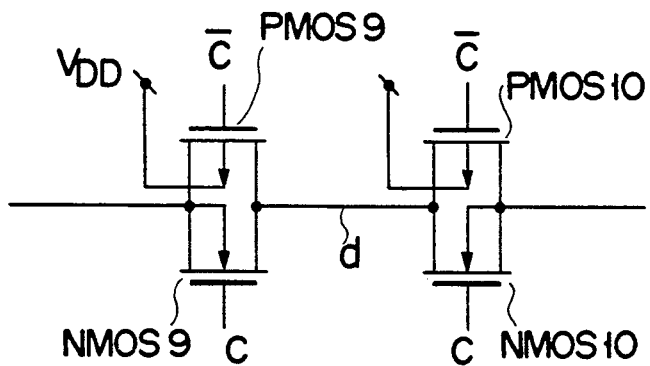
Figure 10:
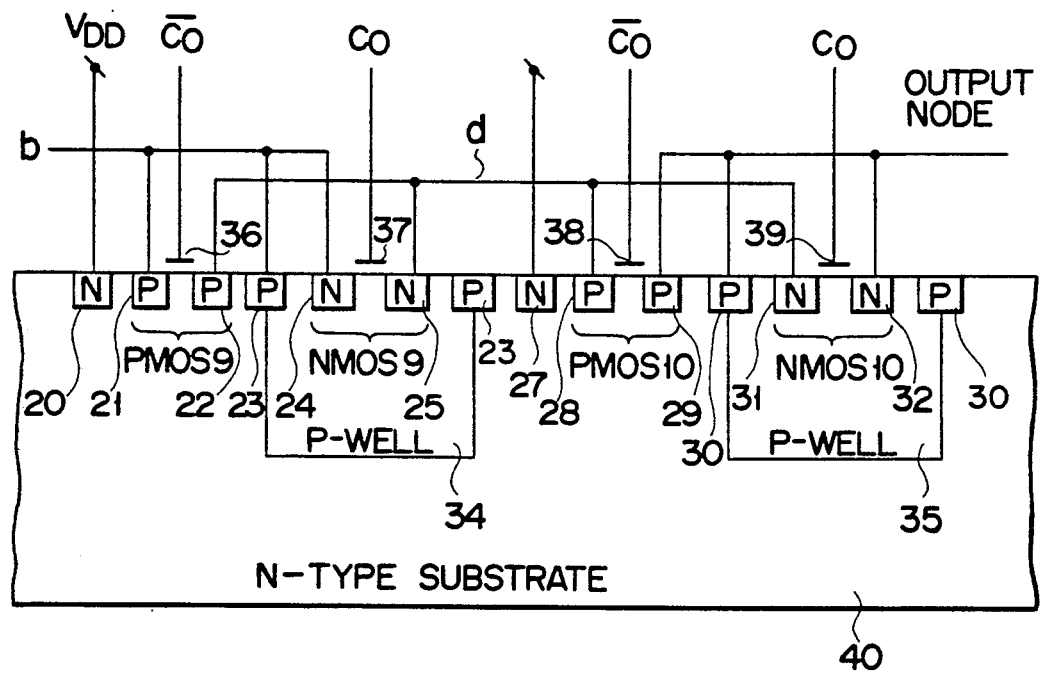
FIG. 10 is a cross sectional view of a semiconductor device incorporating the circuit shown in FIG. 6.

FIG. 6 shows another embodiment of the present invention, wherein transfer gates are connected in series. Substantially similar advantages to those mentioned above are obtained in the FIG. 6 embodiment as well. In the embodiment shown in FIG. 6, however, the PN junction diode between point d and the p-type well of NMOS9 is arranged in the forward direction, if a high positive voltage is applied to an input terminal. Therefore, the amount of current joining the analog signal is larger than the corresponding amount of the FIG. 5 embodiment. FIG. 10 is a cross sectional view of a semiconductor device incorporating the circuit shown in FIG. 6. Since the structural elements of this semi conductor device are indicated by the same reference numerals as are used in FIG. 8, explanation of them structure will be omitted. On this structure of FIG. 10, it is possible to be connected between PMOS9 and PMOS10, NMOS9 and NMOS10 by one line wiring. Therefore, this structure is capable of realizing a semiconductor circuit of small size pattern.

Figure 7:
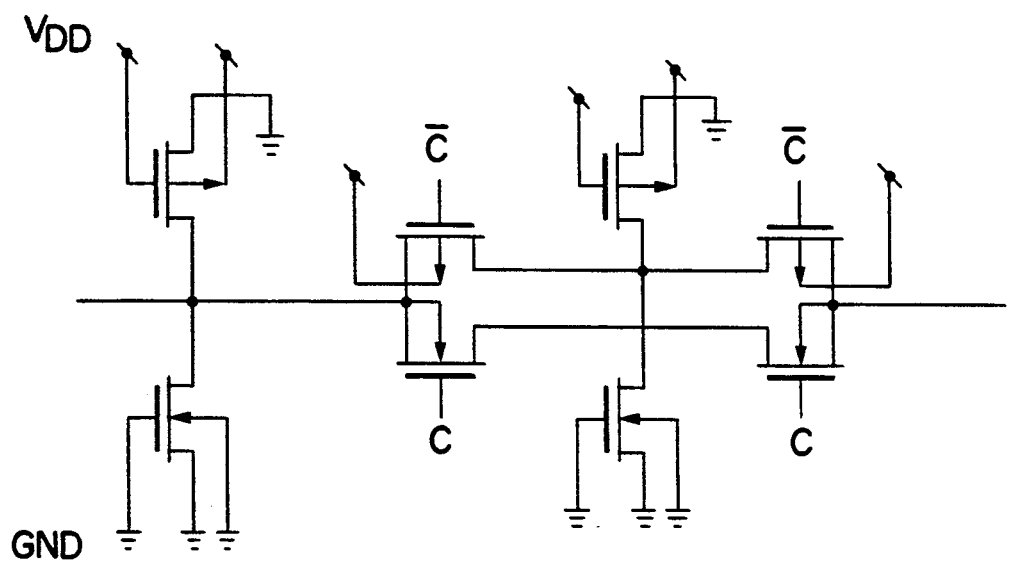

FIG. 7 shows another embodiment of the present invention. This embodiment is similar to the embodiment shown in FIG. 1, except that p-channel and n-channel MOSFETs are inserted at points b and c indicated in FIG. 1. Those MOSFETs are used for the purpose of increasing the number of current paths leading from the input terminal to the power source terminal. In other words, they are used for the purpose of reducing the impedance between the input terminal and the power source terminal. Since the impedance is reduced in the circuit configuration shown in FIG. 7, the amount of current which may be included in the analog signal is reduced. Further, the base of each parasitic bipolar transistor is narrow due to the FET structure, so that the impedance can be further reduced. The reason for employing the n-channel MOSFET is to allow current to flow even if a voltage higher than the breakdown voltage of the n-channel drain is applied to the input terminal.

Figure 11:
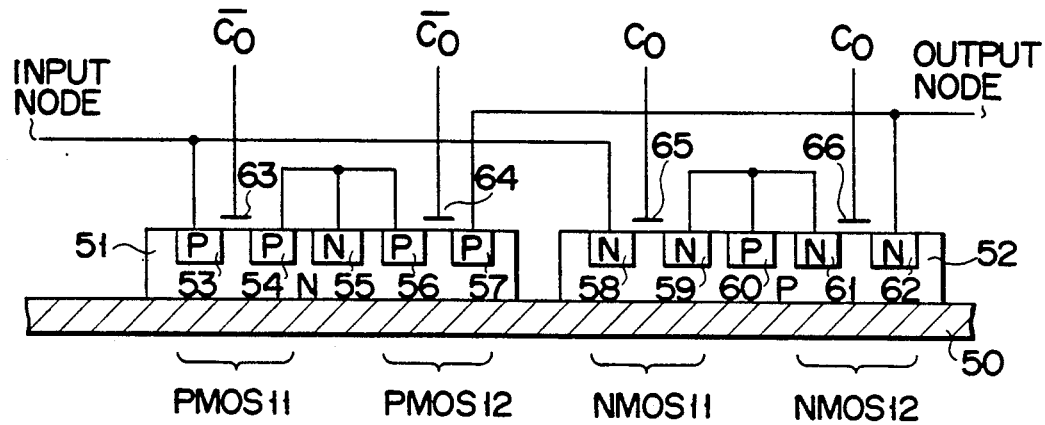
FIG. 11 is a cross sectional view of a semiconductor device of an SOS structure.
Figure 12:
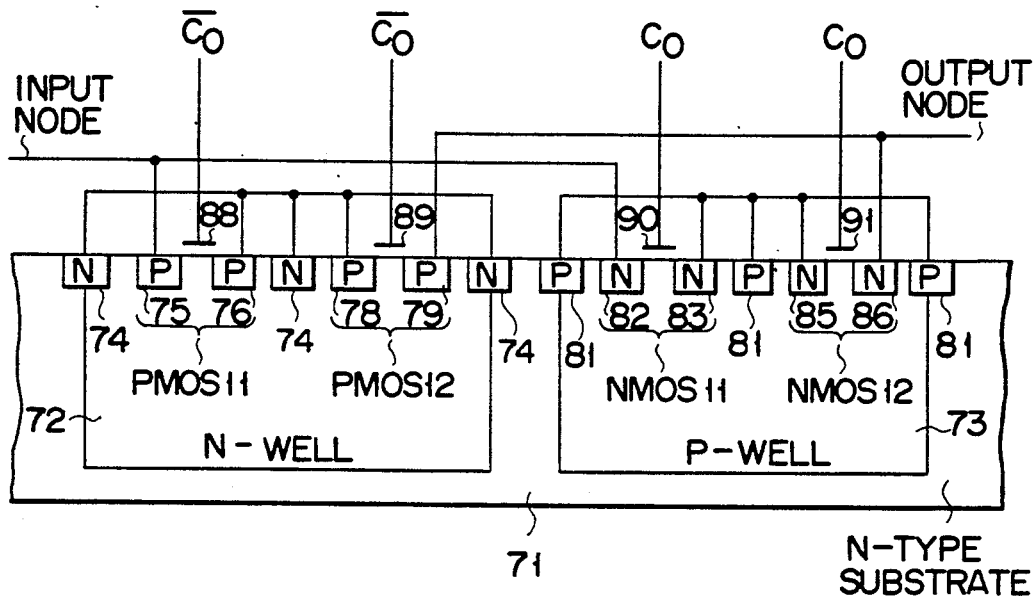
FIG. 12 is a cross sectional view of semiconductor device of a twin-well structure.
Figure 13:
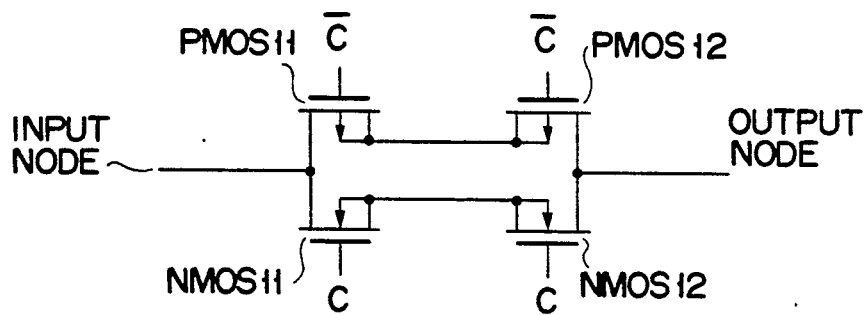
FIG. 13 is a circuit diagram corresponding to the semiconductor devices shown in FIGS. 11 and 12.

FIG. 13 shows another embodiment of the present invention, wherein a p-type well and an n-type well are electrically independent of each other. FIGS. 11 and 12 are cross sectional views of semiconductor devices each incorporating the circuit shown in FIG. 13.

Referring to FIG. 11, n-type well 51 and p-type well 52 are provided on insulator 50 such that they are electrically independent of each other. P-type diffusion layers 53 and 54 are formed in upper regions of n-type well 51. Gate 63 is formed above the region located between p-type diffusion layers 53 and 54, to thereby form p-type MOSFET PMOS11. Further, n-type diffusion layer 55, and p-type diffusion layers 56 and 57 are formed in upper regions of n-type well 51. Gate 64 is formed above the region located between p-type diffusion layers 56 and 57, to thereby form p-type MOSFET PMOS12. Likewise, n-type diffusion layers 58 and 59 are formed in upper regions of p-type well 52, and gate 65 is formed above the region located between n-type diffusion layers 58 and 59, to thereby form n-type MOSFET NMOS11. Further, p-type diffusion layer 60 and n-type diffusion layers 61 and 62 are formed in upper regions of p-type well 52, and gate 66 is formed above the region located between n-type diffusion layers 61 and 62, to thereby form n-type MOSFET NMOS12. Finally, the diffusion layers mentioned above are connected together by external wiring in such a manner as to obtain the circuit shown in FIG. 13.

Referring to FIG. 12, n-type well 7 and p-type well 73 are formed in upper regions of semiconductor layer 71. N-type diffusion layer 74 and p-type diffusion layers 75 and 76 are formed in upper regions of n-type well 72. Gate 88 is formed above the region located between p-type diffusion layers 75 and 76, to thereby form p-type MOSFET 11. Further, n-type diffusion layer 74, and p-type diffusion layers 78 and 79 are formed in upper regions of n-type well 72. Gate 89 is formed above the region located between p-type diffusion layers 78 and 79, to thereby form p-type MOSFET PMOS12. Still further, n-type diffusion layer 74 is formed in an upper region of n-type well 72. Likewise, p-type diffusion layer 81 and n-type diffusion layers 82 and 83 are formed in upper regions of p-type well 73, and gate 90 is formed above the region located between n-type diffusion layers 82 and 83, to thereby form n-type MOSFET NMOS11. Further, p-type diffusion layer 81 and n-type diffusion layers 85 and 86 are formed in upper regions of p-type well 73, and gate 91 is formed above the region located between n-type diffusion layers 85 and 86, to thereby form n-type MOSFET NMOS12. Still further, p-type diffusion layer 81 is formed in an upper region of p-type well 73. Finally, the diffusion layers mentioned above are connected together by external wiring in such a manner as to obtain the circuit shown in FIG. 13.

In this embodiment of FIGS. 11 and 12, even if high positive or negative voltage is applied to the nonselective input terminal, current path is not result between the nonselective input terminal and the output terminal. Therefore, it is possible to compensate for level of the selective analog signal.

In the foregoing embodiments, reference is made of a case where a CMOS is formed by use of a p-type well. Needless to say, however, the present invention may be embodied, with a CMOS formed by use of an n-type well. Further, the present invention may be modified by changing the connection of a well potential or changing the connection of an MOSFET used for reducing the impedance between the input terminal and the power source.

The advantages of the present invention will be described, by taking the embodiment shown in FIG. 1 by way of example.

The PN junction between the well of n-channel MOSFET NMOS5 and the drain electrode thereof and the PN junction between the well of n-channel MOSFET NMOS6 and the drain electrode thereof are connected in opposite directions with reference to each other. Even if a negative voltage lower than the ground-level potential is applied to an input terminal, a reversed-biased PN junction diode exists between the non-selected input terminals, between the analog signal and non-selected input terminals. Therefore, the analog signal is prevented from including an error.

In the case where a voltage higher than the positive power source voltage is applied to an input terminal, one of the bipolar NPN transistors parasitic on n-channel MOS transistors cuts off current. Although current flows through the bipoar PNP transistors parasitic on the p-channel MOSFETs, these parasitic bipolar PNP transistors are lateral types, so that their current gains $\alpha$ (i.e., collector current/emitter current) are no more than 0.5 to 0.6.

Since these parasitic PNP transistors are connected in series with one another, it is possible to obtain the same effects as are derived from p-channel MOSFETs connected in series with one another. More specifically, current Ia which may adversely affects an analog signal is expressed by $Ia = IE \cdot \alpha^n$. Therefore, a current can be reduced to such a degree that the reduced current does not adversely affect the A/D conversion. Accordingly, the analog signal input circuit provided by the present invention does not degrade the accuracy of an A/D converter.

If MOSFETs are employed, as in the embodiment shown in FIG. 7, the impedance between the input terminal and the power source terminal are reduced. Therefore, the amount of emitter current which may flow to parasitic PNP transistor PNP2 is not large. As a result, it is possible to reduce the number of p-channel MOSFETs which have to be connected in series to one another. It is also possible to shorten the sample/hold time of an analog input.

What is claimed is:

1. An analog signal input circuit comprising:
   at least two input terminals;
   an output node;
   a plurality of p-type first FETs located between each of said at least two input terminals and said output node, each of said plurality of p-type first FETs including a gate terminal and a substrate connected to a positive potential power source terminal, wherein a first plurality of respective control signals are supplied to each said gate terminal of each of said plurality of p-type first FETs located between a corresponding input terminal and said output node, and a source of one of said p-type first FETs is connected directly to a drain of another of said p-type first FETS; and
   a plurality of n-type second FETs located between each of said at least two input terminals and said output node, each of said plurality of n-type second FETs including a gate terminal and bipolar transistor structures providing PN junctions whose conduction directions are opposite to each other, wherein a second plurality of respective control signals are supplied to each said gate terminal of each of said plurality of n-type second FETs located between a corresponding input terminal and said output node, and a source of one of said n-type second FETs is connected directly to a drain of another of said n-type second FETs.

2. An analog signal input circuit according to claim 1, wherein each of said second plurality of control signals supplied to each of said plurality of n-type second FETs located between a respective input terminal and said output node is inverted with respect to each of said first plurality of control signals supplied to said plurality of p-type first FETs located between said respective input terminal and said output node.

3. An analog signal input circuit according to claim 1, wherein said first and second plurality of control signals supplied to said first and second FETs, respectively, select one of said plurality of input terminals.

4. An analog signal input circuit according to claim 1, further comprising a resistor located between each respective input terminal and each of said plurality of p-type first FETS located between said respective input terminal and said output node.

5. An analog signal input circuit according to claim 1, further comprising a resistor located between each respective input terminal and said plurality of n-type second FETS located between said respective input terminal and said output node.

6. An analog signal input circuit according to claim 1, further comprising a protective diode located between each of said input terminals and said positive-potential power source terminal.

7. An analog signal input circuit according to claim 1, further comprising a protective diode located between each of said input terminals and a ground potential level terminal.

8. An analog signal input circuit according to claim 1, wherein for each of said plurality of n-type second FETs located between a respective input terminal and said output node, one of said plurality of n-type second FETs has a current path leading to said respective input terminal and is connected to said input terminal, and another of said plurality of n-type second FETs has a current path leading to said output node and is connected to said output node.

9. An analog signal input circuit according to claim 8, wherein each said second FET which has a current path leading to said respective input terminal is connected to said second FET which has a current path leading to said output node.

10. An analog signal input circuit according to claim 8, wherein a node of the current paths of said first FETs is connected to a node of the current paths of said second FETs.

11. An analog signal input circuit comprising:
    at least two input terminals;
    an output node;
    a plurality of p-type first FETs located between each of said at least two input terminals and said output node, each of said plurality of p-type first FETs including a gate terminal and a substrate, wherein a first plurality of respective control signals are supplied to each said gate terminal of each of said plurality of p-type first FETs located between a corresponding input terminal and said output node, and each of said substrates is connected to one another, and a source of one of said p-type first FETs is connected directly to a drain of another one of said p-type first FETS; and
    a plurality of n-type second FETs located between each of said at least two input terminals and said output node, each of said plurality of n-type second FETs including a gate terminal, substrates connected to one another, and FET structures of said n-type second FETs providing PN junctions whose conduction directions are opposite to each other, wherein a second a plurality of respective control signals are supplied to each said gate terminal said plurality of n-type second FETs located between a corresponding input terminal and said output node, and a source of one of said n-type second FETs is connected to a drain of another one of said n-type second FETS.

12. An analog signal input circuit according to claim 11, wherein said first FETs are formed in upper regions of a n-type well, and said second FETs are formed in upper regions of a p-type well electrically isolated from said n-type well.

13. An analog signal input circuit comprising:
    at least two input terminals;
    an output node;
    a plurality of n-type first FETs located between each of said at least two input terminals and said output node, each of said plurality of n-type first FETs including a gate terminal and a substrate, connected to a positive-potential power source terminal wherein a first plurality of respective control signals are supplied to each said gate terminal of each of said plurality of n-type first FETs located between a corresponding input terminal and said output node, and a source of one of said n-type first FETs is connected directly to a drain of another one of said n-type first FETS; and
    a plurality of p-type second FETs located between each of said at least two input terminals and said output node, each of said p-type second FETs including a gate terminal, and bipolar transistor structures providing PN junctions whose conduction directions are opposite to each other, wherein a second plurality of respective control signals are supplied to each of gate terminal of said plurality of p-type second FETs located between a respective input terminal and said output node, and a source of one of said p-type second FETs is connected directly to a drain of another one of said p-type second FETS.

14. An analog signal input circuit according to claim 13, wherein each of said plurality of control signals supplied to said plurality of p-type second FETs located between a respective input terminal and said output node is inverted with respect to said first plurality of control signals supplied to said plurality of n-type first FETs located between said respective input terminal and said output node.

15. An analog signal input circuit according to claim 13, wherein said first and second plurality of control signals supplied to said first and second FETs, respectively, select one of said plurality of input terminals.

16. An analog signal input circuit according to claim 13, further comprising a resistor located between each respective input terminal and each of said plurality of n-type first FETS located between said respective input terminal and said output node.

17. An analog input circuit according to claim 13, further comprising a resistor located between each respective input terminal and said plurality of p-type second FETs located between said respective input terminal and said output node.

18. An analog signal input circuit according to claim 13, further comprising a protective diode located between each of said input terminals and said positive-potential power source terminal.

19. An analog signal input circuit according to claim 13, further comprising a protective diode located between each of said input terminals and a ground potential level terminal.

20. An analog signal input circuit according to claim 13, wherein for each of said plurality of p-type second FETs located between a respective input terminal and said output node, one of said p-type second FETs has a current path leading to said respective input terminal and is connected to said input terminal, and another of said plurality of p-type second FETs has a current path leading to said output node and is connected to said output node.

21. An analog signal input circuit according to claim 20, wherein each said second FET which has a current path leading to said input terminal is connected to said second FET which has a current path leading to said output node.

22. An analog signal input circuit according to claim 20, wherein a node of the current paths of said first FETs is connected to a node of the current paths of said second FETs.

23. An analog signal input circuit comprising:
at least two input terminals;
an output node;
a plurality of n-type first FETs located between each of said at least two input terminals and said output node, each of said plurality of said n-type first FETs including a gate terminal and a substrate, wherein a first plurality of respective control signals are supplied to each said gate terminal of each of said plurality of n-type first FETs located between a corresponding input terminal and said output node, and each said substrate is connected to one another, and a source of one of said n-type first FETs is connected directly to a drain of another one of said n-type first FETS; and
a plurality of p-type second FETs located between each of said at least two input terminals and said output node, each of said p-type second FETs including a gate terminal and substrates connected to one another, wherein a second plurality of respective control signals are supplied to each said gate terminal of said plurality of p-type second FETs located between a corresponding input terminal and said output node, and FET structures of said p-type second FETs providing PN junctions whose conduction directions are opposite to each other, a source of one of said p-type second FETs is connected to a drain of another one of said p-type second FETS.

24. An analog signal input circuit according to claim 23, wherein said first FETs are located in upper regions of a p-type well, and said second FETs are located in upper regions of an n-type well electrically isolated from said p-type well.

25. An analog signal input circuit which has a plurality of input terminals and an output node, comprising:
a plurality of first-conductivity type MOS transistors connected in series with one another and inserted between said output node and each of said input terminals; and
a plurality of second-conductivity type MOS transistors connected in series with one another and inserted between said output node and each of said input terminals, one of said second-conductivity type MOS transistors having a substrate connected to a signal circuit leading to said input terminals, another one of said second-conductivity type MOS transistors having a substrate connected to a signal circuit leading to said output node.

26. An analog signal input circuit according to claim 25, wherein each of said first-conductivity type MOS transistors includes a gate terminal and a substrate to which a first predetermined potential is applied, wherein a first plurality of respective control signals are supplied to each gate terminal of each of said first-conductivity type MOS transistors inserted between a corresponding input terminal and said output node.

27. An analog signal input circuit according to claim 26, wherein each of said second-conductivity type MOS transistors includes a gate terminal, wherein a second plurality of respective control signals are supplied to each gate terminal of each of said second conductivity type MOS transistors inserted between a corresponding input terminal and said output node, and wherein the second control signal is inverted with respect to the first control signal.

28. An analog signal input circuit according to claim 25, wherein:
said one second-conductivity type MOS transistor has an NPN bipolar transistor structure which is parasitic thereon, said NPN bipolar transistor being equivalent to a PN junction diode whose anode is connected to said input terminal; and
said PN junction diode has a cathode connected to a cathode of a PN junction diode of said another second-conductivity type MOS transistor.

29. An analog signal input circuit comprising:
a first input terminal;
a second input terminal;
an output node;

a plurality of p-type first FETs located between said first input terminal and said output node, each of said plurality of p-type first FETs including a gate terminal to which a first control signal is supplied, and substrates connected to a positive-potential power source terminal, wherein a source of one of said p-type first FETs is connected directly to a drain of another one of said p-type first FETs; and a plurality of n-type second FETs located between said first input terminal and said output node, said n-type second FETs including gate terminals to which a second control signal is supplied, and bipolar transistor structures of FET structures providing PN junctions whose conduction directions are opposite to each other, wherein a source of one of said n-type second and FETs is connected directly to a drain of another of said n-type second FETs.

30. An analog signal input circuit comprising:

a first input terminal;

a second input terminal;

an output node;

a plurality of p-type first FETs located between said first input terminal and said output node, each of said p-type first FETs including a gate terminal to which a first control signal is supplied, and a substrate connected to a positive-potential power source terminal, wherein a source of one of said p-type first FETs is connected directly to a drain of another one of said p-type first FETs;

a plurality of n-type second FETs located between said first input terminal and said output node, said n-type second FETs including a gate terminal to which a second control signal is supplied, and bipolar transistor structures on FET structures providing PN junctions whose conduction directions are opposite to each other, wherein a source of one of said n-type second FETs is connected directly to a drain of another one of said n-type second FETs;

a plurality of p-type third FETs located between said second input terminal and said output node, each of said p-type third FETs including a gate terminal to which a third control signal is supplied, and a substrate connected to a positive-potential power source terminal, wherein a source of one of said p-type third FETs is connected directly to a drain of another one of said p-type third FETs; and a plurality of n-type fourth FETs located between said second input terminal and said output node, each of said n-type fourth FETs including a gate terminal to which a fourth control signal is supplied, and bipolar transistor structures on FET structures providing PN junctions whose conduction directions are opposite to each other, wherein a source of one of said n-type fourth FETs is connected directly to a drain of another said n-type fourth FETs.

* * * * *